United States Patent
Nakagawa (10) Patent No.: US 10,372,001 B2
(45) Date of Patent: Aug. 6, 2019

(54) DISPLAY APPARATUS AND METHOD OF MANUFACTURING DISPLAY APPARATUS

(71) Applicant: Sakai Display Products Corporation, Sakai-shi, Osaka (JP)

(72) Inventor: Hidetoshi Nakagawa, Sakai (JP)

(73) Assignee: Sakai Display Products Corporation, Sakai-shi, Osaka (JP)

( * ) Notice: Subject to any disclaimer, the term of this patent is extended or adjusted under 35 U.S.C. 154(b) by 161 days.

(21) Appl. No.: 15/533,926

(22) PCT Filed: Dec. 24, 2014

(86) PCT No.: PCT/JP2014/084172
§ 371 (c)(1),
(2) Date: Jun. 7, 2017

(87) PCT Pub. No.: WO2016/103370
PCT Pub. Date: Jun. 30, 2016

(65) Prior Publication Data
US 2017/0329191 A1    Nov. 16, 2017

(51) Int. Cl.
*G02F 1/1333* (2006.01)
*G02F 1/1362* (2006.01)
(Continued)

(52) U.S. Cl.
CPC ...... *G02F 1/136286* (2013.01); *G02F 1/1343* (2013.01); *G02F 1/136259* (2013.01);
(Continued)

(58) Field of Classification Search
CPC ..... G02F 1/136286; G02F 2001/13456; G02F 2001/136254; G02F 1/136259; G02F 2001/136263; G02F 2001/136272
See application file for complete search history.

(56) References Cited

U.S. PATENT DOCUMENTS

2011/0141071 A1   6/2011   Ozeki et al.
2014/0132873 A1*  5/2014   Ogasawara ......... G02F 1/13452
                                                              349/43

FOREIGN PATENT DOCUMENTS

JP         2004-4492 A       1/2004
WO      WO2010021075 A1     2/2010

* cited by examiner

*Primary Examiner* — Paisley L Arendt
(74) *Attorney, Agent, or Firm* — Bret E. Field; Bozicevic, Field & Francis LLP (57) ABSTRACT

A display device according to the present invention is provided with: a display panel that has a display area and a non-display area; a plurality of signal lines that are provided on the display panel; a spare wire (40) that extends to the non-display area and the outside of the display panel and that should be connected to the signal lines; a plurality of connection terminals that are provided on the display panel; and amplifiers (7) that are connected, at input sides thereof, to first connection terminals (21), that should be connected, at output sides thereof, to the spare wire (40), and that are located outside the display panel. The display device is characterized in that: the spare wire (40) has divided first spare-wire sections (411 and 421) and a second spare-wire section; and the display device is provided with a connection section (4) that is connected to ends of the first spare-wire sections (411 and 421) and that should be connected to other signal lines; first connecting lines (61) that are connected to the output sides of the amplifiers (7), that extend from the outside of the display panel to the non-display area, and that are connected to second connection terminals (22); and second connecting lines (62) that should connect fourth connection terminals (24) to the second connection terminals (22) or third connection terminals (23).

10 Claims, 8 Drawing Sheets

(51) Int. Cl.
   *G02F 1/1343*  (2006.01)
   *H01L 27/12*  (2006.01)
   G02F 1/1345  (2006.01)
   H01L 27/146  (2006.01)
(52) U.S. Cl.
   CPC .......... *H01L 27/124* (2013.01); *G02F 1/1345* (2013.01); *G02F 1/133345* (2013.01); *G02F 2001/136263* (2013.01); *H01L 27/14609* (2013.01)

DISPLAY APPARATUS AND METHOD OF MANUFACTURING DISPLAY APPARATUS

This application is the national phase under 35 U.S.C. § 371 of PCT International Application No. PCT/JP2014/084172 which has International filing date of Dec. 24, 2014 and designated the United States of America.

FIELD

The technology herein relates to a display apparatus which displays an image and a method of manufacturing a display apparatus.

BACKGROUND AND SUMMARY

Thin display apparatuses, for example, liquid crystal display apparatuses, have been widely distributed since a display area is large while its installation area is small. For example, in an active matrix type liquid crystal display apparatus, a plurality of data signal lines and scanning signal lines are arranged in a matrix.

A thin film transistor and a pixel electrode connected to the thin film transistor are provided in the vicinity of an intersection point of both signal lines. ON-OFF control of the thin film transistor is carried out by the scanning signal line, and if signal potentials are applied to each pixel electrode from the data signal line, an alignment state of liquid crystal is changed, thus to display information.

In recent years, further improvement of display quality has been required, and a line width of the data signal line has become very thin as 10 μm or less (for example, 6 μm). Therefore, a disconnection may easily occur in a manufacturing process. For example, if dust is entrained during film formation or pinholes are generated in a resist mask during etching, a disconnection occurs.

If a disconnection occurs in the data signal line, a correct signal potential cannot be written in the pixel electrode after the disconnecting location. As a result, a black line (in a normally black mode) and a bright line (in a normally white mode) appear on a screen.

In order to correct such a disconnection, for example, a spare wiring is provided from the vicinity of an end part on a signal input side of the data signal line to the vicinity of an end part on a side opposite to the signal input side of the line (a lower side of a display region) through a substrate located externally a display panel or the like.

The end part (a terminal end part) of the portion after the disconnecting location in the disconnected data signal line and the spare wiring are connected by melting with a laser beam or the like so that a signal is input to the portion after the disconnecting location.

If resistance values in the data signal line and the spare wiring are large, a large loss may occur in a signal output which is input through the spare wiring. Therefore, it is preferable that the resistance values in the data signal line and the spare wiring are small.

In consideration of the above-mentioned circumstances, it is an object to provide an aspect of disclosure of a display apparatus which may reduce resistance values in a data signal line and a spare wiring, and a method of manufacturing a display apparatus.

According to an aspect of disclosure, there is provided a display apparatus comprises: a display panel having a display region and a non-display region located at peripheries of the display region; a plurality of signal lines provided in the display panel to transmit an image signal; a spare wiring routed to the non-display region of the display panel and an outside of the display panel, and which is to be connected to the signal lines; a plurality of connection terminals provided in the display panel; and an amplifier which has an input side connected to a first connection terminal and an output side that is to be connected to the spare wiring, and which is located at the outside of the display panel, wherein a signal is to be input from one signal line to the amplifier through the first connection terminal, and the spare wiring has a first spare wiring part and a second spare wiring part which are separated each other. The display apparatus further comprises a connection part which is connected to one end side of the first spare wiring part, and is to be connected to the other signal lines; and a first connection line which is connected to the output side of the amplifier, is routed from the outside of the display panel to the non-display region of the display panel, and is connected to a second connection terminal, wherein the other end side of the first spare wiring part is routed from the outside of the display panel to the non-display region of the display panel, and is connected to a third connection terminal, and the second spare wiring part is routed from the outside of the display panel to the non-display region of the display panel, and is connected to a fourth connection terminal. The display apparatus further comprises a second connection line which is to be connected to the fourth connection terminal, and the second connection terminal or the third connection terminal.

According to another aspect of the disclosure, the second connection line crosses over the first connection line, the first spare wiring part and the second spare wiring part through an insulation film.

According to another aspect of the disclosure, the display apparatus comprises an identification mark configured to identify a connecting location of the second connection line and the first connection line or a connecting location of the second connection line and the first spare wiring part.

According to another aspect of the disclosure, the second connection terminal and the fourth connection terminal are connected with each other, and the second connection line crosses over the first spare wiring part and the second spare wiring part through an insulation film.

According to another aspect of the disclosure, a method of manufacturing the display apparatus comprises: inspecting whether each of the plurality of signal lines is disconnected; and if a disconnection of the signal line is detected in the inspection step, connecting the second connection line, and the second connection terminal and the fourth connection terminal or connecting the second connection line, and the third connection terminal and the fourth connection terminal.

According to another aspect of the disclosure, a display apparatus comprises a display panel having a display region and a non-display region located at peripheries of the display region; signal lines provided in the display panel to transmit an image signal; a spare wiring routed to an outside of the display panel and the non-display region of the display panel, and which is to be connected to the signal lines; a plurality of connection terminals provided in the non-display region of the display panel; and an amplifier which has an input side connected to a first connection terminal and an output side connected to the spare wiring, and is located at the outside of the display panel, wherein a signal is to be input from the signal line to the amplifier through the first connection terminal. The display apparatus further comprises a first connection line which is connected to the output side of the amplifier, is routed from the outside of the display panel to the non-display region of the display panel, and is connected to a second connection terminal; and a second connection line which is to be connected to a third connection terminal, wherein the spare wiring is connected to the third connection terminal.

According to another aspect of the disclosure, the display apparatus comprises a second spare wiring routed to the outside of the display panel, wherein the second spare wiring is connected to a fourth connection terminal, and the second connection line is a line which is to be connected to the third connection terminal and the fourth connection terminal.

According to another aspect of the disclosure, a method of manufacturing the display apparatus comprises: inspecting whether each of the plurality of signal lines is disconnected; and if a disconnection of the signal line is detected in the inspection step, connecting the second connection line, and the second connection terminal and the third connection terminal or connecting the second connection line, and the second connection terminal and the fourth connection terminal.

According to the display apparatus and the method of manufacturing the display apparatus, for example, if one signal line is disconnected, the one signal line and the amplifier are connected with each other, and the second connection terminal and the fourth connection terminal, and the second connection line are connected with each other.

According to the display apparatus and the method of manufacturing the display apparatus, melt connection of the second connection line, and the second connection terminal, the third connection terminal and the fourth connection terminal may be achieved.

According to the display apparatus and the method of manufacturing the display apparatus, a manufacturer may confirm the identification marks to easily recognize the location to be disconnected.

According to the display apparatus and the method of manufacturing the display apparatus, for example, if the other signal line is disconnected, the other signal line and the connection part are connected with each other, the third connection terminal and the fourth connection terminal, and the second connection line are connected with each other, and the second connection terminal and the fourth connection terminal are cut off.

According to the display apparatus and the method of manufacturing the display apparatus, if the signal line is disconnected, the signal line and the amplifier are connected with each other through the first connection terminal, and the second connection line, and the second and third connection terminals are connected with each other.

According to the display apparatus and the method of manufacturing the display apparatus, if the signal line is disconnected, the signal line and the amplifier are connected with each other through the first connection terminal, and the second connection terminal, and the third or fourth connection terminal are connected with each other through the second connection line.

In accordance with the display apparatus and the method of manufacturing the display apparatus, for example, if one signal line is disconnected, the one signal line and the amplifier are connected with each other through the first connection terminal, and the second connection terminal and the fourth connection terminal, and the second connection line are connected with each other. The second connection terminal is connected with the first connection line, and the first connection line is routed to the outside of the display panel. In addition, the fourth connection terminal is connected with the second spare wiring part, and the second spare wiring part is routed to the outside of the display panel. Therefore, a distance from a connecting location of the one signal line and the first connection terminal to the spare wiring is decreased, and thereby a resistance of an entire wiring after the repair may be reduced.

In addition, in accordance with the display apparatus and the method of manufacturing the display apparatus, for example, if the signal line is disconnected, the signal line and the amplifier are connected with each other through the first connection terminal, and the second connection line, and the second and third connection terminals are connected with each other. Further, the output side of the amplifier is connected to the second connection terminal. Since the second and third connection terminals are connected to the spare wiring, a distance from the connecting location of the signal line and the first connection terminal to the spare wiring is decreased, and thereby a resistance of the entire wiring after the repair may be reduced.

The above and further objects and features will more fully be apparent from the following detailed description with accompanying drawings.

DETAILED DESCRIPTION OF NON-LIMITING EXAMPLE EMBODIMENTS

Embodiment 1

Figure 1:
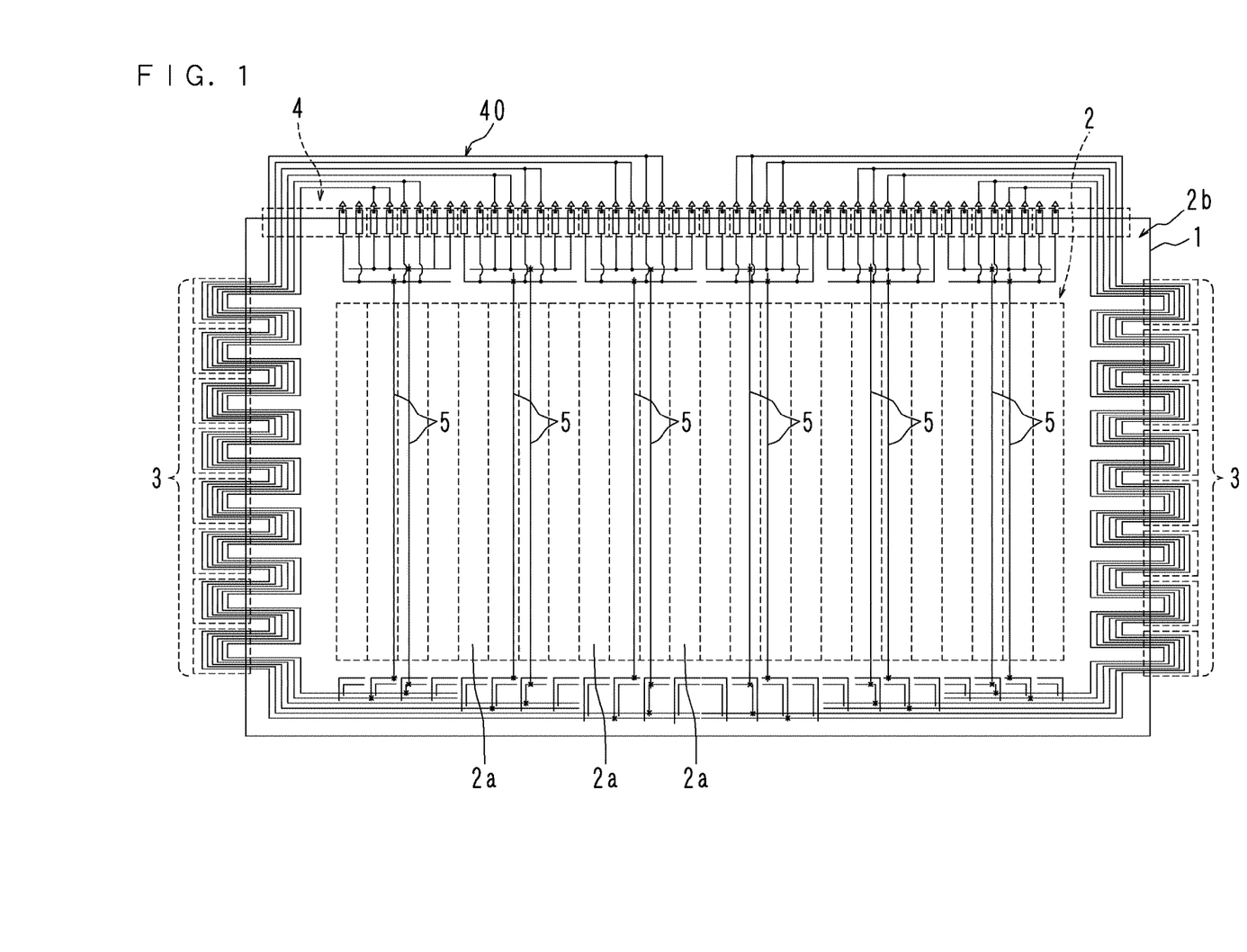
FIG. 1 is a plan view schematically illustrating a major part of a display apparatus according to Embodiment 1.
Figure 2:
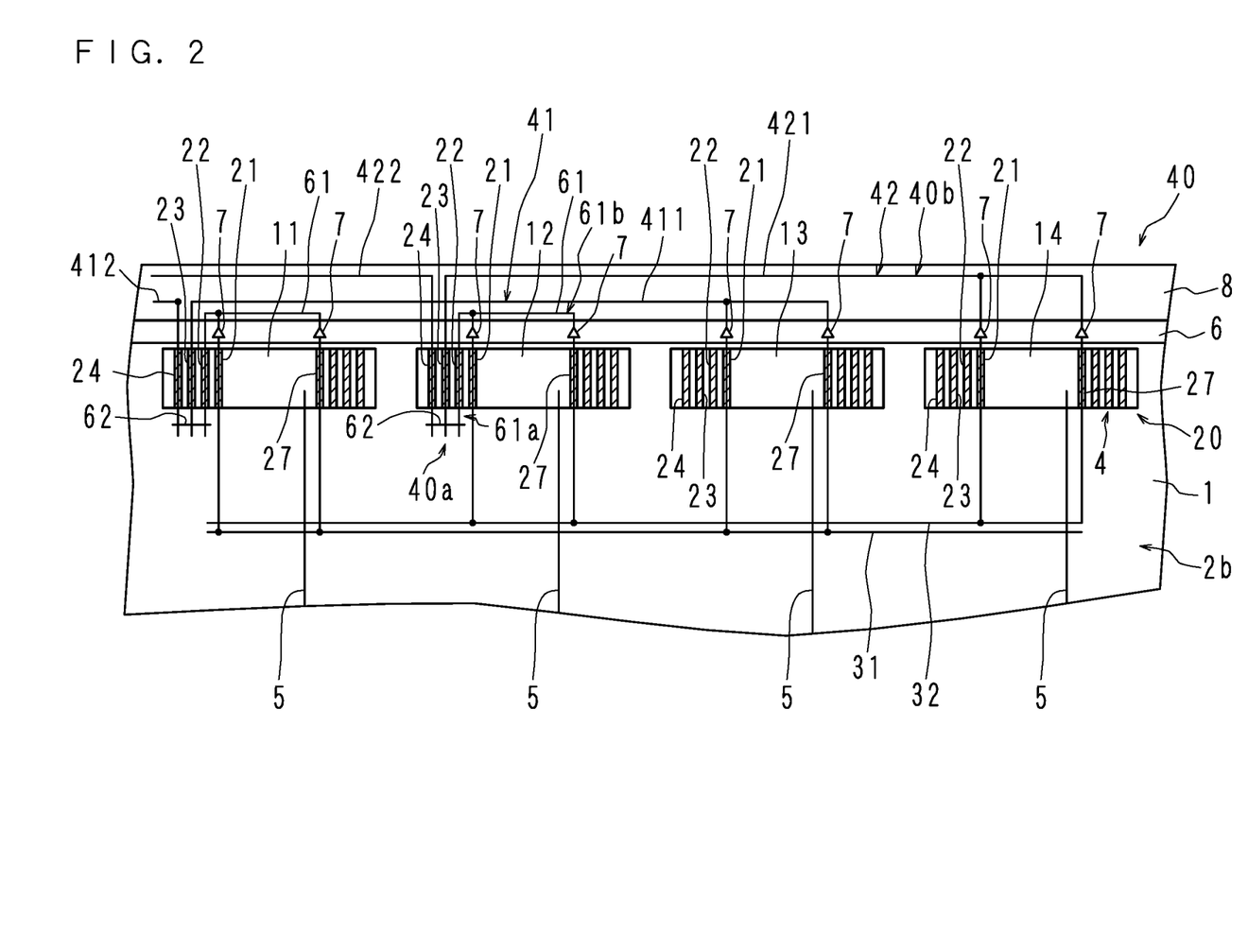
FIG. 2 is an enlarged plan view schematically illustrating a configuration in the vicinity of a source terminal part.

Hereinafter, the present invention will be described with reference to the drawings illustrating a display apparatus according to Embodiment 1. FIG. 1 is a plan view schematically illustrating a major part of the display apparatus, and FIG. 2 is an enlarged plan view schematically illustrating a configuration in the vicinity of a source terminal part.

The display apparatus has a laterally long rectangular display panel 1 having liquid crystal, and a central part of the display panel 1 is a display region 2 on which a laterally long rectangular image is displayed. In the display panel 1, peripheries of the display region 2 becomes a non-display region 2b formed in a laterally elongated rectangular frame shape, on which an image is not displayed. A plurality of gate terminal parts 3, 3, . . . and 3 are longitudinally arranged in parallel on respective short sides of the display panel 1 (a right side or a left side in FIG. 1). From the respective gate terminal parts 3, scanning signal lines (not illustrated) extend in a lateral direction. In the display region 2, a plurality of data signal lines 5, 5, . . . and 5 extending in a longitudinal direction are arranged in parallel in the lateral direction. The data signal line 5 and the scanning signal line are orthogonal to each other, and are arranged in a matrix on the display panel 1.

A thin film transistor (not illustrated) and a pixel electrode (not illustrated) connected to the thin film transistor are provided in the vicinity of an intersection point of the data signal line 5 and the scanning signal line. ON-OFF control of the thin film transistor is carried out by the scanning signal line, and if a signal potential is applied to each pixel electrode from the data signal line 5, an alignment state of the liquid crystal is changed, thus to display information.

The display region 2 has a plurality of (twenty-four in the present embodiment) vertically split display blocks 2a, 2a, . . . and 2a. The data signal line 5 is provided in each of the display blocks 2a. Further, in FIG. 1, a part of the data signal lines 5 is not illustrated.

As illustrated in FIG. 2, a source substrate 8 is provided at an outside on one long side (an upper side in FIG. 1) of the display panel 1. The source substrate 8 is located adjacent to the display panel 1, and is located at the outside of the non-display region 2b.

A plurality of spare wirings 40 are disposed at the peripheries of the display panel 1, and the spare wirings 40 are provided in the non-display region 2b or outside of the display panel 1. The spare wiring 40 is routed along one long side of the display panel 1 from a middle part on one long side to the short side, and is further routed to the other long side (a lower side in FIG. 1) along the short side. On the short side, the spare wiring 40 is connected to the gate terminal part 3. The spare wiring 40 is further routed to a central part of the other long side of the display panel 1. Both end parts of the data signal line 5 are provided to be connected to the spare wiring 40 on both long sides of the display panel 1, respectively.

In the non-display region 2b, a plurality of (twenty-four in the present embodiment) source terminal parts 4, 4, . . . and 4 are arranged in parallel in the lateral direction on one long side of the display panel 1. Each of the source terminal parts 4 corresponds to the respective display blocks 2a, and corresponds to the respective data signal lines 5. The source terminal part 4 includes a plurality of connection terminals 20, 20, . . . and 20 arranged in parallel in the lateral direction.

The plurality of connection terminals 20 include first to fourth connection terminals 21 to 24, and an amplifier connection terminal 27. The first to fourth connection terminals 21 to 24 are sequentially arranged. The amplifier connection terminal 27 is separated from the first to fourth connection terminals 21 to 24. Further, the first connection terminal 21 functions as an amplifier connection terminal.

Between the source terminal part 4 and the display block 2a, a first trunk line 31 and a second trunk line 32 are provided in the non-display region 2b of the display panel 1. Each of the first trunk line 31 and the second trunk line 32 extends in the lateral direction across the four source terminal parts 4, 4, 4, and 4. Hereinafter, the four source terminal parts 4 will be referred to as first to fourth source terminal parts 11 to 14, respectively. The first to fourth source terminal parts 11 to 14 are sequentially arranged in the lateral direction.

The first trunk line 31 is connected to input sides of the first connection terminal 21 and the amplifier connection terminal 27, in the first source terminal part 11 and the third source terminal part 13. The second trunk line 32 is connected to the input sides of the first connection terminal 21 and the amplifier connection terminal 27, in the second source terminal part 12 and the fourth source terminal part 14.

One end part of the data signal line 5 is orthogonal to the first trunk line 31 and the second trunk line 32 in a plan view. The data signal line 5 is laminated on the first trunk line 31 and second trunk line 32 are laminated through an insulation film (not illustrated). In other words, the data signal line 5 and the first trunk line 31 and second trunk line 32 are not electrically connected. By irradiating an intersection point of one end part of the data signal line 5 and the first trunk line 31 or the second trunk line 32 with a laser beam, both lines may be connected by melting.

Further, in the other long side portion of the display panel 1, two L-shaped trunk lines orthogonal to the other end part of the data signal line 5 and the spare wiring 40 are provided in a plan view. The trunk lines and the other end part of the data signal line 5 and the spare wiring 40 are not electrically connected. By irradiating the respective intersection points of the other end part of the data signal line 5 and spare wiring 40 and the trunk lines with a laser beam, the respective intersection points may be connected by melting.

Two spare wirings 40 and 40 are assigned to four display blocks 2a, 2a, 2a and 2a, and the two spare wirings 40 are mounted on the source substrate 8. Hereinafter, the two spare wirings 40 are referred to as a first spare wiring 41 and a second spare wiring 42. The first spare wiring 41 and the second spare wiring 42 extend on the source substrate 8 in the lateral direction.

The first spare wiring 41 includes a first spare wiring part 411 and a second spare wiring part 412, which are separated from each other. The second spare wiring 42 includes a first spare wiring part 421 and a second spare wiring part 422, which are separated from each other.

Chip on films (COFs) 6 are provided between the display panel 1 and the source substrate 8, and two amplifiers 7 and 7 are mounted on the COF 6. Although a plurality of COFs 6 are provided corresponding to the connection terminals 20, in order to facilitate the understanding, the COFs 6 are illustrated in a simplified manner in FIG. 2. An input side of one amplifier 7 is connected to an amplifier connection terminal 27. An input side of the other amplifier 7 is connected to the first connection terminal 21.

In the first source terminal part 11, respective output sides of the amplifiers 7 and 7 are connected to the second connection terminal 22 through a first connection line 61 routed from the outside of the display panel 1 to the display panel 1. An end part of the first connection line 61 connected to the second connection terminal 22 extends from the second connection terminal 22 to the display region 2 side.

In the third source terminal part 13, the respective output sides of the amplifiers 7 and 7 are connected to one end side of the first spare wiring part 411 routed to the outside of the display panel 1. The other end side of the first spare wiring part 411 is routed from the outside of the display panel 1 to the display panel 1, and is connected to the third connection terminal 23 of the first source terminal part 11. The other end part of the first spare wiring part 411 extends from the third connection terminal 23 to the display region 2 side.

One end side of the second spare wiring part 412 is routed from the outside of the display panel 1 to the display panel 1, and is connected to the fourth connection terminal 24 of the first source terminal part 11. One end part of the second spare wiring part 412 extends from the fourth connection terminal 24 to the display region 2 side. The other end side of the second spare wiring part 412 is routed to the other long side of the display panel 1, as described above.

In the first source terminal part 11, a second connection line 62 is provided so as to be orthogonal to the end part of the first connection line 61, the other end part of the first spare wiring part 411 and the one end part of the second spare wiring part 412 in a plan view. The second connection line 62 is laminated on the end part of the first connection line 61, the other end part of the first spare wiring part 411 and the one end part of the second spare wiring part 412 are laminated through an insulation film (not illustrated) to face each other. In other words, the second connection line 62, and the end part of the first connection line 61, the other end part of the first spare wiring part 411 and the second spare wiring part 412 are not electrically connected. By irradiating intersection points of the second connection line 62, and the end part of the first connection line 61, the other end part of the first spare wiring part 411 and the second spare wiring part 412 with a laser beam, both intersection points may be connected by melting.

In the second source terminal part 12, the respective output sides of the amplifiers 7 and 7 are connected to the second connection terminal 22 through the first connection line 61 routed from the outside of the display panel 1 to the display panel 1. The end part of the first connection line 61 connected to the second connection terminal 22 extends from the second connection terminal 22 to the display region 2 side.

In the fourth source terminal part 14, the respective output sides of the amplifiers 7 and 7 are connected to one end side of the first spare wiring part 421 routed to the outside of the display panel 1. The other end side of the first spare wiring part 421 is routed from the outside of the display panel 1 to the display panel 1, and is connected to the third connection terminal 23 of the second source terminal part 12. The other end part of the first spare wiring part 421 extends from the third connection terminal 23 to the display region 2 side.

One end side of the second spare wiring part 422 is routed from the outside of the display panel 1 to the display panel 1, and is connected to the fourth connection terminal 24 of the second source terminal part 12. One end part of the second spare wiring part 422 extends from the fourth connection terminal 24 to the display region 2 side. The other end side of the second spare wiring part 422 is routed to the other long side of the display panel 1, as described above.

In the second source terminal part 12, the second connection line 62 is provided so as to be orthogonal to the end part of the first connection line 61, the other end part of the first spare wiring part 421 and the one end part of the second spare wiring part 422 in a plan view. The second connection line 62 is laminated on the end part of the first connection line 61, the other end part of the first spare wiring part 421 and the second spare wiring part 422 are laminated through an insulation film (not illustrated) to face each other. In other words, the second connection line 62, and the end part of the first connection line 61, the other end part of the first spare wiring part 421 and the second spare wiring part 422 are not electrically connected. By irradiating the intersection points of the second connection line 62, and the end part of the first connection line 61, the other end part of the first spare wiring part 421 and the second spare wiring part 422 with a laser beam, both intersection points may be connected by melting.

The source terminal part 4 and the second connection line 62 are formed in the display panel 1. The source substrate 8 is provided at the outside of the display panel 1. The spare wiring 40, the first connection line 61, and the second connection line 62 are made of substantially the same material (for example, copper). Thicknesses of a portion 61a of the first connection line 61 formed in the display panel 1, a portion 40a of the spare wiring 40 formed in the display panel 1, and the second connection line 62 are thinner than those of portions 61b and 40b formed at the outside of the display panel 1, for example, on the source substrate 8 or the COF 6. Therefore, a resistance value in the source terminal part 4 is higher than the resistance value in the source substrate 8 or the COF 6. In other words, the resistance in the display panel 1 is higher than the resistance in the outside of the display panel 1.

Figure 3:
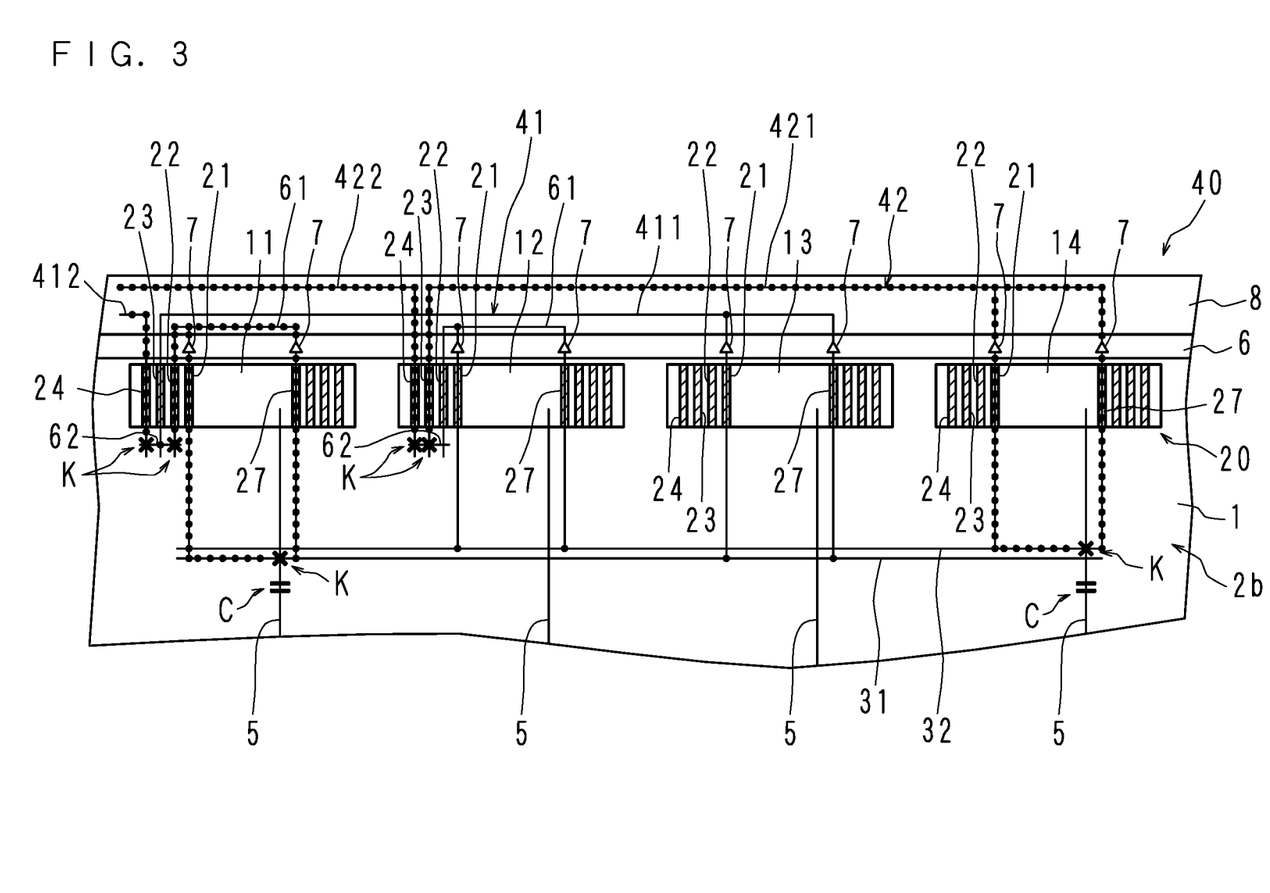
FIG. 3 is an enlarged plan view schematically illustrating a state in which, if data signal lines corresponding to first and fourth source terminal parts are disconnected, the data signal lines are connected to a first trunk line and a second trunk line, respectively.

FIG. 3 is an enlarged plan view schematically illustrating a state in which, if the data signal lines 5 and 5 corresponding to the first and fourth source terminal parts 11 and 14 are disconnected, the data signal lines 5 and 5 are connected to the first trunk line 31 and the second trunk line 32, respectively. Further, in FIG. 3, double lines indicate cutting locations C, and cross marks indicate connecting locations K. In addition, dots indicate that a signal from the data signal line 5 is being transmitted to the spare wiring 40.

An inspection to check whether the data signal line 5 is disconnected is performed on the display apparatus, and then the display apparatus is manufactured. In this inspection, for example, if it is found that the data signal lines 5 and 5 corresponding to the first and fourth source terminal parts 11 and 14 are disconnected, one end part of the data signal line 5 corresponding to the first source terminal part 11 and the first trunk line 31 are connected by melting. Further, in the first source terminal part 11, the second connection line 62, and the end part of the first connection line 61 and the one end part of the second spare wiring part 412 are connected by melting.

Furthermore, in the other long side portion of the display panel 1, by irradiating the respective intersection points of the other end part of the data signal line 5 corresponding to the first source terminal part 11 and the other end part of the second spare wiring part 412 and the trunk lines with a laser beam, the respective intersection points are connected by melting.

In addition, one end part of the data signal line 5 corresponding to the fourth source terminal part 14 and the second trunk line 32 are connected by melting. Further, in the second source terminal part 12, the second connection line 62, and the other end part of the first spare wiring part 421 and the one end part of the second spare wiring part 422 are connected by melting.

Further, in the other long side portion of the display panel 1, by irradiating the respective intersection points of the other end part of the data signal line 5 corresponding to the fourth source terminal part 14 and the other end part of the second spare wiring part 422 and the trunk lines with a laser beam, the respective intersection points are connected by melting.

In the second source terminal part 12, by connecting only the third and fourth connection terminal 23 and 24, a signal transmitted to the second spare wiring part 422 is not input to the output side of the amplifier 7 connected to the second source terminal part 12. Therefore, a damage of the amplifier 7 may be prevented.

Further, if the data signal lines 5 corresponding to the first and fourth source terminal parts 11 and 14 are not disconnected, and the data signal line 5 corresponding to the second source terminal part 12 is disconnected, one end part of the data signal line 5 and the second trunk line 32 may be connected by melting. In this case, in the second source terminal part 12, the second connection line 62, and the end part of the first connection line 61 and the one end part of the second spare wiring part 422 are connected by melting. Further, in the other long side portion of the display panel 1, by irradiating the respective intersection points of the other end part of the data signal line 5 corresponding to the second source terminal part 12 and the other end part of the second spare wiring part 412 and the trunk lines with a laser beam, the respective intersection points are connected by melting.

If the data signal lines 5 corresponding to the first and fourth source terminal parts 11 and 14 are not disconnected, and the data signal line 5 corresponding to the third source terminal part 13 is disconnected, one end part of the data signal line 5 and the first trunk line 31 may be connected by melting. In this case, in the first source terminal part 11, the second connection line 62, and the other end part of the first spare wiring part 411 and the one end part of the second spare wiring part 412 are connected by melting. Further, in the other long side portion of the display panel 1, by irradiating the respective intersection points of the other end part of the data signal line 5 corresponding to the third source terminal part 13 and the other end part of the second spare wiring part 412 and the trunk lines with a laser beam, the respective intersection points are connected by melting.

In the display apparatus and a method of manufacturing the display apparatus according to Embodiment 1, if the data signal line 5 corresponding to the first source terminal part 11 is disconnected, the data signal line 5 and the amplifier 7 are connected with each other through the first connection terminal 21, and the second connection terminal 22 and the fourth connection terminal 24, and the second connection line 62 are connected with each other.

The second connection terminal 22 is connected with the first connection line 61, and the first connection line 61 is routed to the outside of the display panel 1. In addition, a resistance value of the connection terminal 20 is higher than that of the spare wiring 40 routed to the outside of the display panel 1. Further, the fourth connection terminal 24 is connected with the second spare wiring part 412, and the second spare wiring part 412 is routed to the outside of the display panel 1.

Therefore, a distance from the connecting location of the data signal line 5 and the first trunk line 31, in other words the connecting location of the data signal line 5 and the first connection terminal 21, to the spare wiring 40 with a lower resistance value is decreased, and thereby the resistance of an entire wiring after the repair may be reduced.

In addition, the second connection line 62, and the first connection line 61, the first spare wiring part 411 and the second spare wiring part 412 face each other, such that melt connection of the second connection line 62, and the first connection line 61, the first spare wiring part 411 and the second spare wiring part 412 may be achieved, and the second connection line 62, and the second connection terminal 22, the third connection terminal 23 and the fourth connection terminal 24 may be connected.

Embodiment 2

Figure 4:
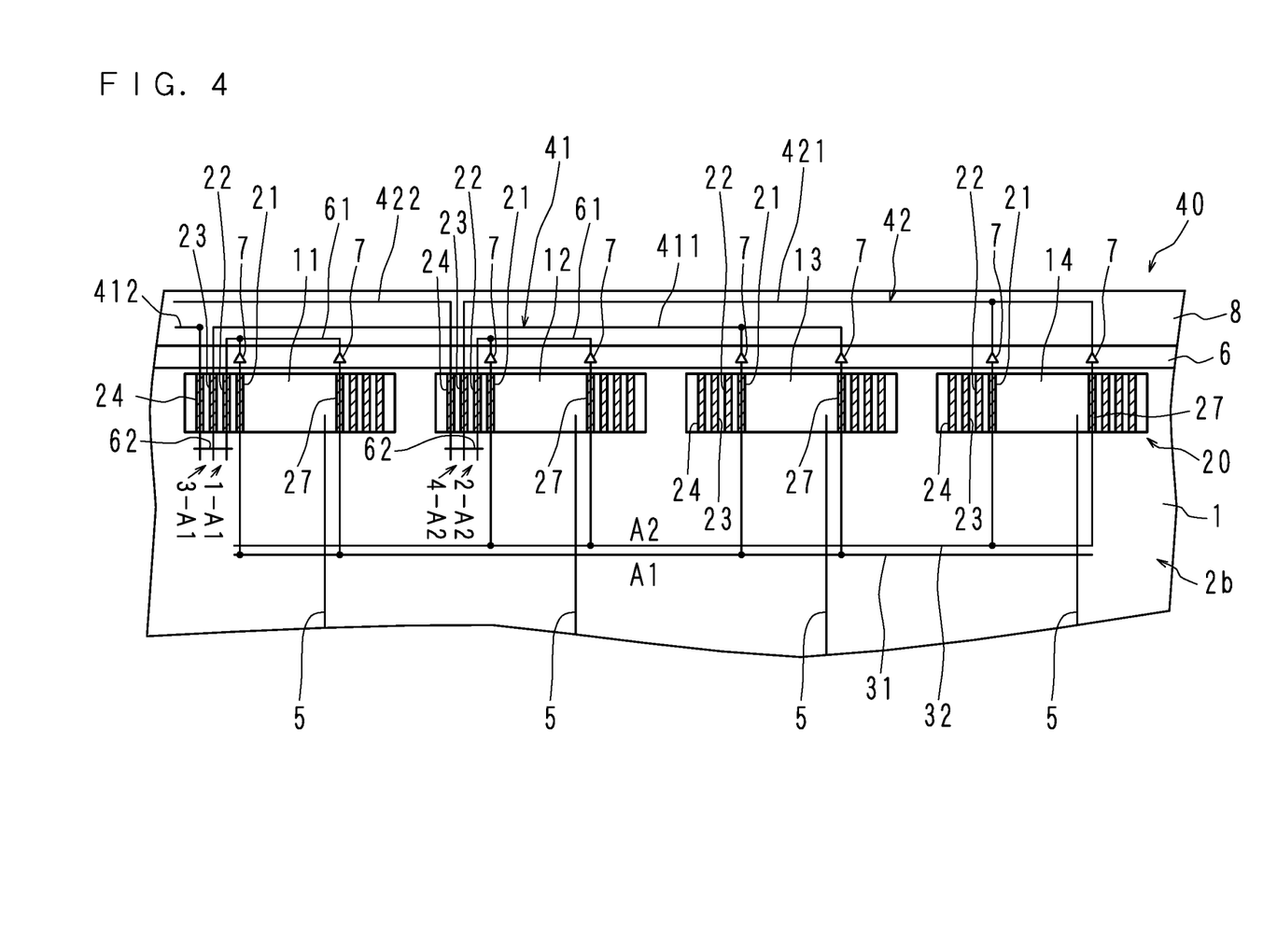
FIG. 4 is an enlarged plan view schematically illustrating a configuration in the vicinity of a source terminal part of a display apparatus according to Embodiment 2.

Hereinafter, the present invention will be described with reference to the drawings illustrating a display apparatus according to Embodiment 2. FIG. 4 is an enlarged plan view schematically illustrating a configuration in the vicinity of a source terminal part 4. Except for identification marks to be described below, the configuration of the display apparatus according to Embodiment 2 is equal to that of Embodiment 1.

"A1" and "A2" for identifying the first trunk line 31 and the second trunk line 32 are denoted in the vicinity of the first trunk line 31 and the second trunk line 32, respectively.

In addition, in the first source terminal part 11, "1-A1" is denoted to an intersection point of the first connection line 61 connected to the second connection terminal 22 and the second connection line 62, and "3-A1" is denoted to an intersection point of the first spare wiring part 411 connected to the third connection terminal 23 and the second connection line 62 together with arrows.

Further, in the second source terminal part 12, "2-A2" is denoted to an intersection point of the first connection line 61 connected to the second connection terminal 22 and the second connection line 62, and "4-A2" is denoted to an intersection point of the first spare wiring part 421 connected to the third connection terminal 23 and the second connection line 62 together with arrows.

Identification marks in a type of the "X-AY" (wherein, X=1 to 4 and Y=1 or 2) indicate portions in which the second connection line 62, and the X-th source terminal part and the Y-th trunk line are connected with each other. For example, "1-A1" indicates a portion in which the second connection line 62, and the first source terminal part 11 and the first trunk line 31 are connected with each other. Further, "Terminal 1" to "Terminal 4" for identifying the first to fourth source terminal parts 11 to 14 may be denoted to the first to fourth source terminal parts 11 to 14, respectively.

In the display apparatus and a method of manufacturing the display apparatus according to Embodiment 2, by providing the identification marks, a manufacturer may confirm the identification marks to easily recognize the location to be connected. Therefore, it is possible to increase manufacturing efficiency of the display apparatus.

Embodiment 3

Figure 5:
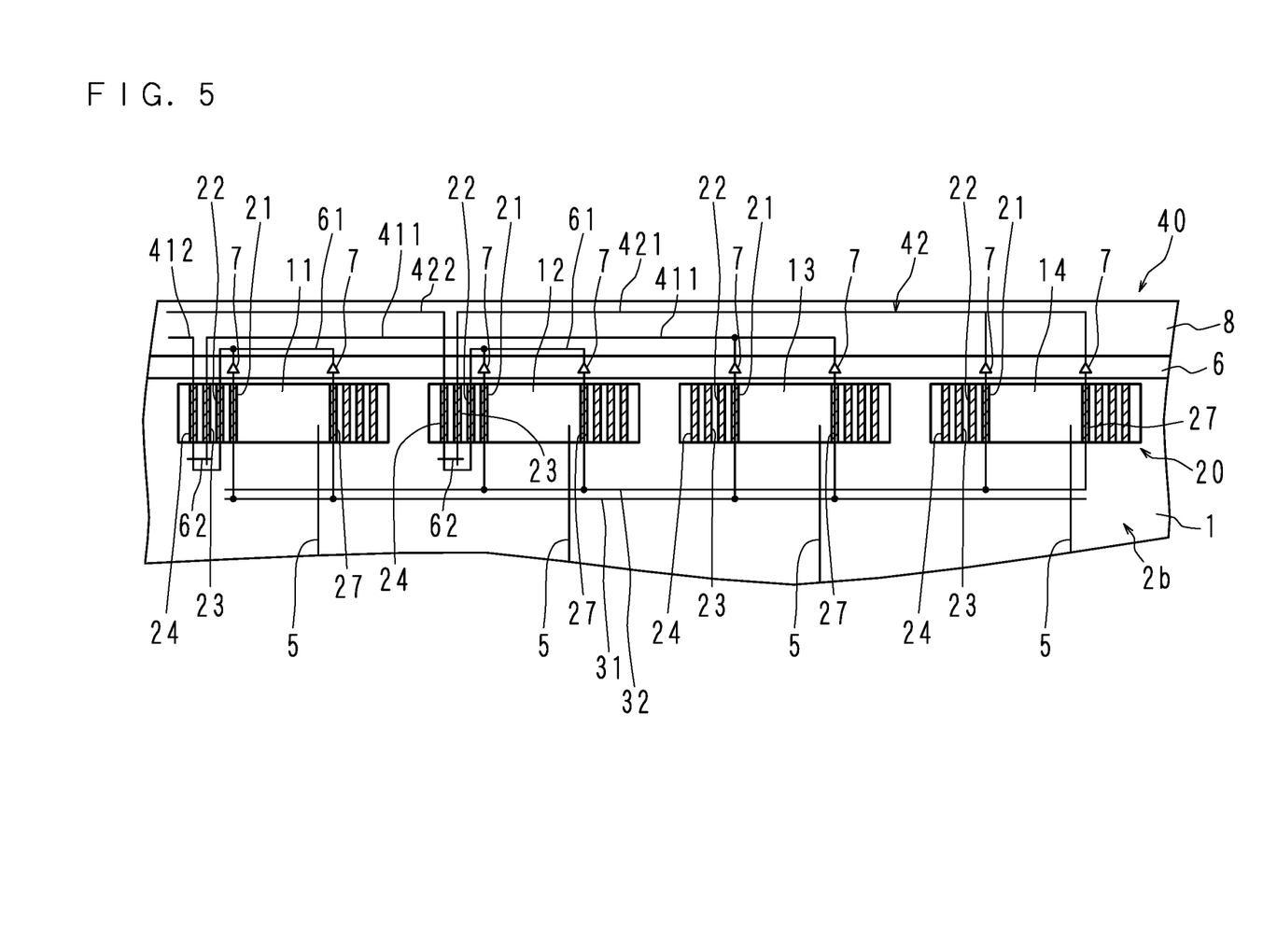
FIG. 5 is an enlarged plan view schematically illustrating a configuration in the vicinity of a source terminal part of a display apparatus according to Embodiment 3.

Hereinafter, the present invention will be described with reference to the drawings illustrating a display apparatus according to Embodiment 3. FIG. 5 is an enlarged plan view schematically illustrating a configuration in the vicinity of a source terminal part 4.

In the first source terminal part 11, an end part of the first connection line 61 connected to the second connection terminal 22 and one end part of the second spare wiring part 412 connected to the fourth connection terminal 24 are connected with each other. In addition, the second connection line 62 is provided so as to be orthogonal to the one end part of the second spare wiring part 412 and the other end part of the first spare wiring part 411 connected to the third connection terminal 23 in a plan view. The second connection line 62 faces each of the one end part of the second spare wiring part 412 and the other end part of the first spare wiring part 411 through an insulation film 63, and does not electrically connect to them.

In the second source terminal part 12, an end part of the first connection line 61 connected to the second connection terminal 22 and one end part of the second spare wiring part 422 connected to the fourth connection terminal 24 are connected with each other. In addition, the second connection line 62 is provided so as to be orthogonal to the one end part of the second spare wiring part 422 and the other end part of the first spare wiring part 421 connected to the third connection terminal 23 in a plan view. The second connection line 62, and the one end part of the second spare wiring part 422 and the other end part of the first spare wiring part 421 face each other through an insulation film, and are not electrically connected.

Figure 6:
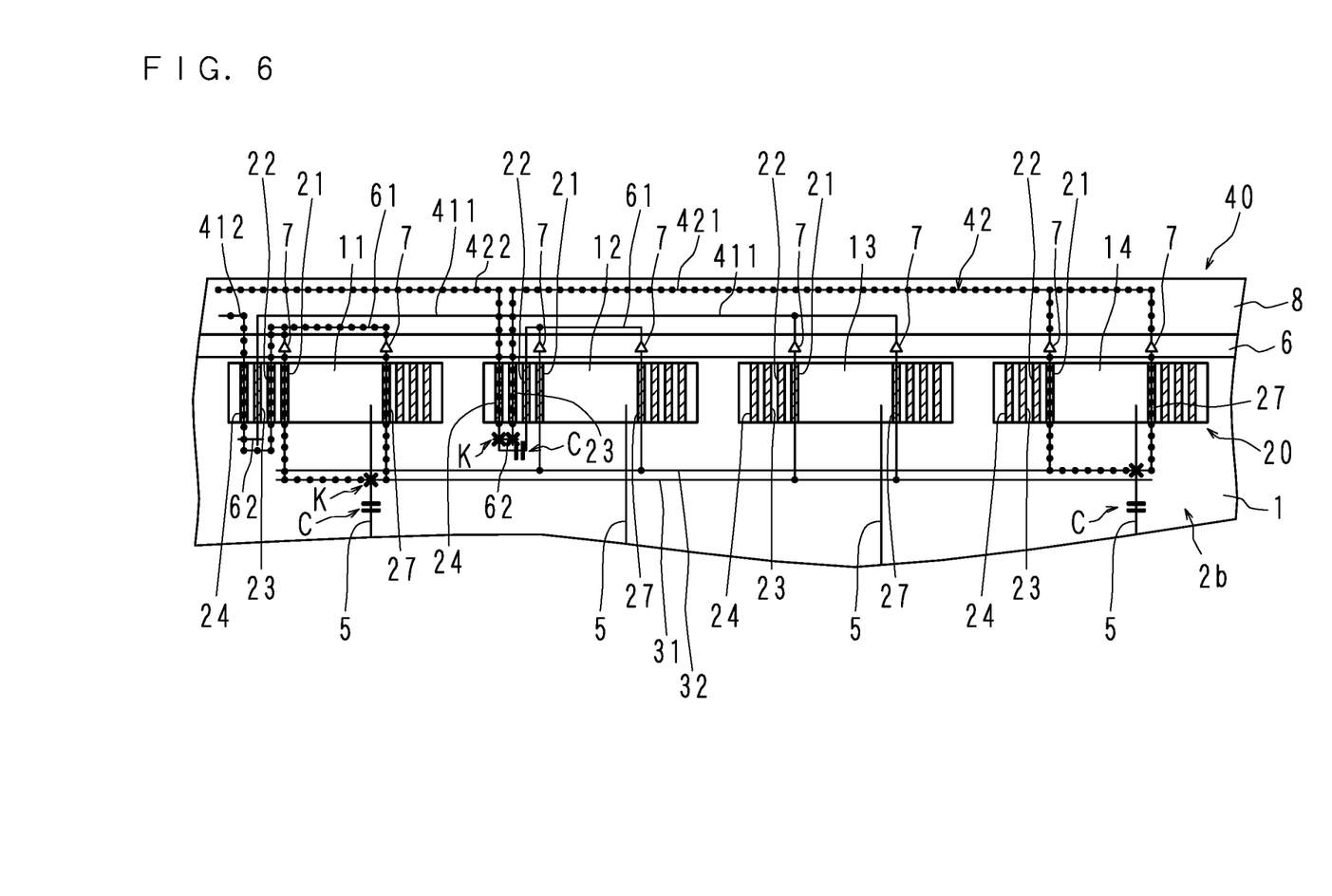
FIG. 6 is an enlarged plan view schematically illustrating a state in which, if the data signal lines corresponding to the first and fourth source terminal parts are disconnected, the data signal lines are connected to the first trunk line and the second trunk line, respectively.

FIG. 6 is an enlarged plan view schematically illustrating a state in which, if the data signal lines 5 and 5 corresponding to the first and fourth source terminal parts 11 and 14 are disconnected, the data signal lines 5 and 5 are connected to the first trunk line 31 and the second trunk line 32, respectively.

An inspection to check whether the data signal line 5 is disconnected is performed on the display apparatus, and then the display apparatus is manufactured. In this inspection, for example, if it is found that the data signal lines 5 and 5 corresponding to the first and fourth source terminal parts 11 and 14 are disconnected, one end part of the data signal line 5 corresponding to first source terminal part 11 and the first trunk line 31 are connected by melting.

Furthermore, in the other long side portion of the display panel 1, by irradiating the respective intersection points of the other end part of the data signal line 5 corresponding to the first source terminal part 11 and the other end part of the second spare wiring part 412 and the trunk lines with a laser beam, the respective intersection points are connected by melting.

In addition, one end part of the data signal line 5 corresponding to the fourth source terminal part 14 and the second trunk line 32 are connected by melting. Further, in the second source terminal part 12, the second connection line 62, and the other end part of the first spare wiring part 421 and the one end part of the second spare wiring part 422 are connected by melting. In addition, the end part of the first connection line 61 and the one end part of the second spare wiring part 412 are cut off. In other words, the second connection terminal 22 and the fourth connection terminal 24 are cut off.

Further, in the other long side portion of the display panel 1, by irradiating the respective intersection points of the other end part of the data signal line 5 corresponding to the fourth source terminal part 14 and the other end part of the second spare wiring part 422 and the trunk lines with a laser beam, the respective intersection points are connected by melting.

In the display apparatus and a method of manufacturing the display apparatus according to Embodiment 3, if the data signal line 5 corresponding to the fourth source terminal part 14 is disconnected, the data signal line 5 and the fourth source terminal part 14 are connected with each other. In addition, in the second source terminal part 12, the second connection line 62, and the third and fourth connection terminals 23 and 24 are connected, and the second connection terminal 22 and the fourth connection terminal 24 are cut off.

Also, similarly to the case in which the data signal line 5 corresponding to the third source terminal part 13 is disconnected, connection and disconnection are performed on the first source terminal part 11.

If the data signal line 5 corresponding to the first source terminal part 11 or the second source terminal part 12 is disconnected, only by connecting the data signal line 5 and the first trunk line 31 or the second trunk line 32, the line is directly connected to the spare wiring 40, and the connection work may be completed in a short time.

The same parts of the configuration of the display apparatus according to Embodiment 3 as those in Embodiment 1 or 2 will be denoted by the same reference numerals, and will not be described in detail.

Embodiment 4

Figure 7:
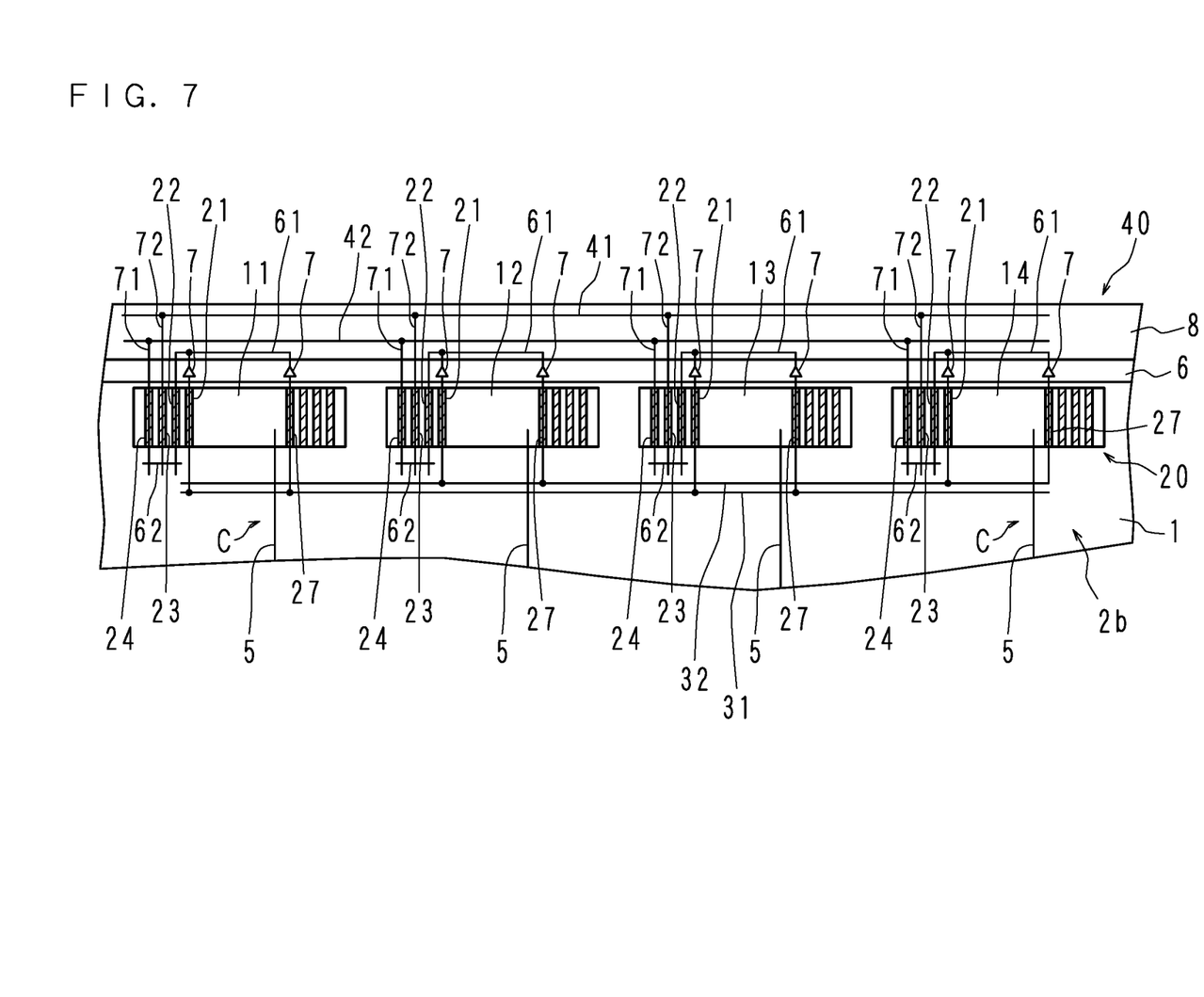
FIG. 7 is an enlarged plan view schematically illustrating a configuration in the vicinity of a source terminal part of a display apparatus according to Embodiment 4.

Hereinafter, the present invention will be described with reference to the drawings illustrating a display apparatus according to Embodiment 4. FIG. 7 is an enlarged plan view schematically illustrating a configuration in the vicinity of a source terminal part 4.

The first and second spare wirings 41 and 42 are provided in the source substrate 8, and are located at the outside of the display panel 1. The first spare wiring 41 is connected to one end side of a second wiring 72. The other end side of the second wiring 72 is connected to the third connection terminal 23. The other end part of the second wiring 72 extends from the third connection terminal 23 to the display region 2 side.

The second spare wiring 42 is connected to one end side of a first wiring 71. The other end side of the first wiring 71 is connected to the fourth connection terminal 24. The other end part of the first wiring 71 extends from the fourth connection terminal 24 to the display region 2 side.

The second connection line 62 is provided so as to be orthogonal to the end part of the first connection line 61, the other end part of the first wiring 71 and the other end part of the second wiring 72 in a plan view. The second connection line 62 is laminated on the end part of the first connection line 61, the other end part of the first wiring 71 and the other end part of the second wiring 72 through an insulation film 63 to face each other. That is, the second connection line 62, and the end part of the first connection line 61, the other end part of the first wiring 71 and the other end part of the second wiring 72 are not electrically connected.

Figure 8:
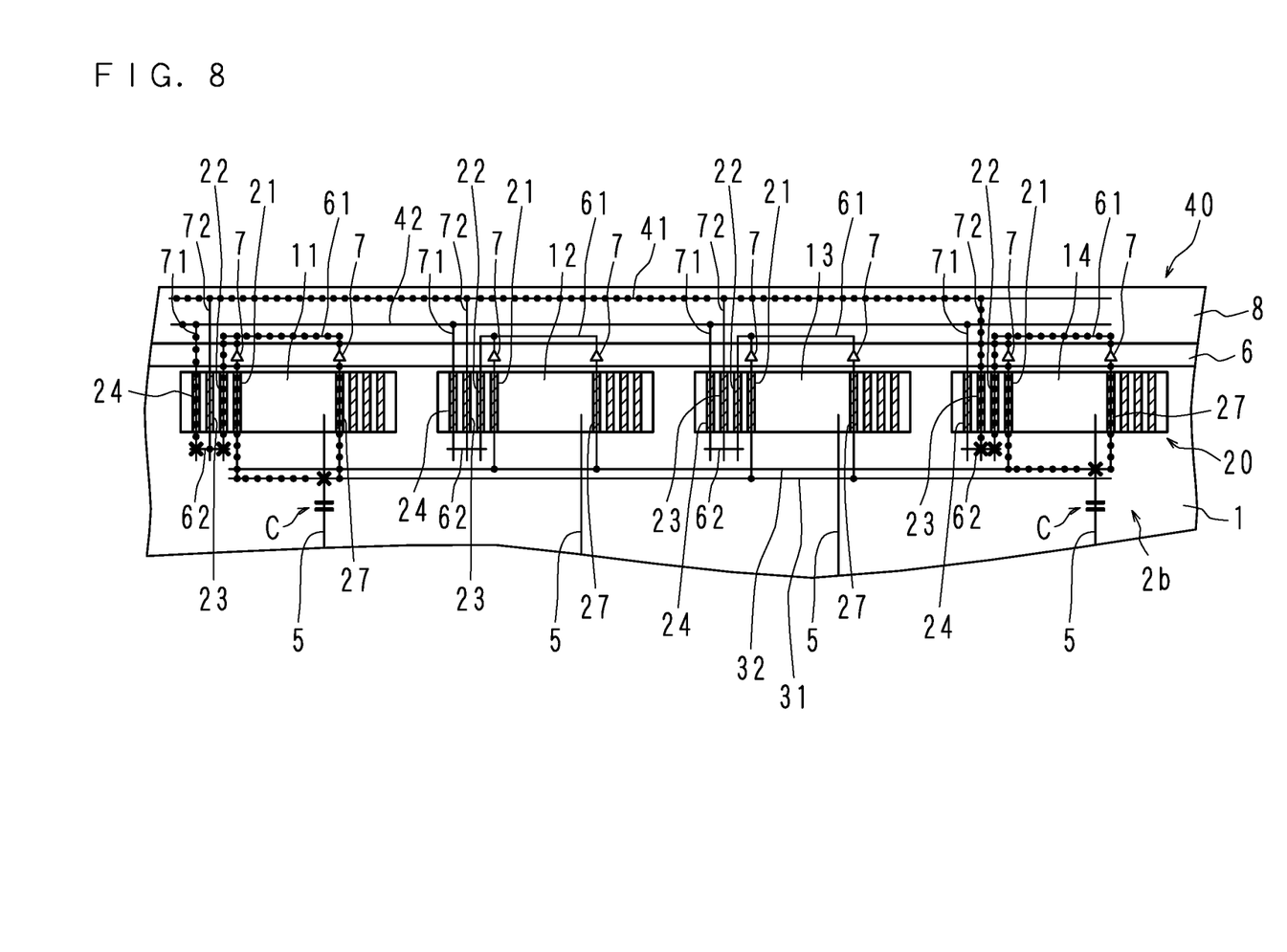
FIG. 8 is an enlarged plan view schematically illustrating a state in which, if the data signal lines corresponding to the first and fourth source terminal parts are disconnected, the data signal lines are connected to the first trunk line and the second trunk line, respectively.

FIG. 8 is an enlarged plan view schematically illustrating a state in which, if the data signal lines 5 and 5 corresponding to the first and fourth source terminal parts 11 and 14 are disconnected, the data signal lines 5 and 5 are connected to the first trunk line 31 and the second trunk line 32, respectively.

An inspection to check whether the data signal line 5 is disconnected is performed on the display apparatus, and then the display apparatus is manufactured. In this inspection, for example, if it is found that the data signal lines 5 and 5 corresponding to the first and fourth source terminal parts 11 and 14 are disconnected, one end part of the data signal line 5 corresponding to first source terminal part 11 and the first trunk line 31 are connected by melting.

In the first source terminal part 11, the second connection line 62, and the end part of the first connection line 61 and the other end part of the first wiring 71 are connected by melting. Further, in the other long side portion of the display panel 1, by irradiating the respective intersection points of the other end part of the data signal line 5 corresponding to the first source terminal part 11 and the second spare wiring 42 and the trunk lines with a laser beam, the respective intersection points are connected by melting.

One end part of the data signal line 5 corresponding to the fourth source terminal part 14 and the second trunk line 32 are connected by melting. In addition, in the fourth source terminal part 14, the second connection line 62, the end part of the first connection line 61 and the other end part of the second wiring 72 are connected by melting. Further, in the other long side portion of the display panel 1, by irradiating the respective intersection points of the other end part of the data signal line 5 corresponding to the fourth source terminal part 14 and the first spare wiring 41 and the trunk lines with a laser beam, the respective intersection points are connected by melting.

Furthermore, if the data signal line 5 corresponding to the second or third source terminal part 12 or 13 is disconnected, similarly, the second connection line 62, and the end part of the first connection line 61, the other end part of the first wiring 71 and the other end part of the second wiring 72 are connected with each other.

In the display apparatus and a method of manufacturing the display apparatus according to Embodiment 4, if the data signal line 5 is disconnected, for example, the second connection line 62, and the second and third connection terminals 22 and 23 are connected with each other.

The output side of the amplifier 7 is connected to the second connection terminal 22. In addition, a resistance value of the connection terminal 20 is higher than that of the spare wiring 40. Since the second and third connection terminals 22 and 23 are connected to the spare wiring 40, a distance from the connecting location of the data signal line 5 and the second trunk line 32, in other words the connecting location of the data signal line 5 and the first connection terminal 21, to the spare wiring 40 with a lower resistance value is decreased, and thereby the resistance of an entire wiring after the repair may be reduced.

In addition, if the data signal line 5 is disconnected, for example, the second connection line 62, and the second and fourth connection terminals 22 and 24 are connected with each other.

The output side of the amplifier 7 is connected to the second connection terminal 22. In addition, the resistance value of the connection terminal 20 is higher than that of the spare wiring 40. Since the second and fourth connection terminals 22 and 24 are connected to the second spare wiring 42, the distance from the connecting location of the data signal line 5 and the first trunk line 31, in other words the connecting location of the data signal line 5 and the first connection terminal 21, to the second spare wiring 42 with a lower resistance value is decreased, and thereby the resistance of an entire wiring after the repair may be reduced.

The same parts of the configuration of the display apparatus according to Embodiment 4 as those in Embodiments 1 to 3 will be denoted by the same reference numerals, and will not be described in detail.

Further, also in Embodiments 2 to 4, as similar to Embodiment 1, the resistance of the spare wiring in the display panel 1 is higher than the resistance of the spare wiring in the outside of the display panel 1.

It is to be noted that, as used herein and in the appended claims, the singular forms "a", "an", and "the" include plural referents unless the context clearly dictates otherwise.

As this description may be embodied in several forms without departing from the spirit of essential characteristics thereof, the present embodiment is therefore illustrative and not restrictive, since the scope is defined by the appended claims rather than by the description preceding them, and all changes that fall within metes and bounds of the claims, or equivalence of such metes and bounds thereof are therefore intended to be embraced by the claims.

The invention claimed is:

1. A display apparatus, comprising:
a display panel having a display region and a non-display region located at peripheries of the display region;
a first connection part located in the non-display region which includes a first connection terminal, a second connection terminal, a third connection terminal and a fourth connection terminal each of which includes a first part and a second part connected to a wiring and each of which joins two wirings connected to the first part and the second part respectively;
a second connection part located in the non-display region which includes a fifth connection terminal which includes a first part and a second part connected to a wiring and which joins two wirings connected to the first part and the second part respectively;
a first signal line elongated from the first connection part to the display region to transmit an image signal;
a second signal line elongated from the second connection part to the display region to transmit an image signal;
a first amplifier which has an input side connected to the first part of the first connection terminal and is located at an outside of the display panel;
a second amplifier which has an input side connected to the first part of the fifth connection terminal and is located at the outside of the display panel;
a trunk line located in the non-display region of the display panel and connected to the second part of the first connection terminal and the second part of the fifth connection terminal, and connectable to each of the first signal line and the second signal line;
a first connection line which is connected to an output side of the first amplifier and which is connected to the first part of the second connection terminal from the outside of the display panel;
a second connection line located in the non-display region of the display panel, so as to connect the second part of the fourth connection terminal to the second part of the second connection terminal or the second part of the third connection terminal;
a third connection line which is connected to an output side of the second amplifier and which is connected to the first part of the third connection terminal from the outside of the display panel; and
a spare wiring which is connected to the first part of the fourth connection terminal, which is routed to the non-display region of the display panel and the outside of the display panel, and which is connectable to each of the first signal line and the second signal line.

2. The display apparatus according to claim 1, comprising:
a second terminal wiring connected to the second part of the second connection terminal and located at the non-display region;
a third terminal wiring connected to the second part of the third connection terminal and located at the non-display region; and
a fourth terminal wiring connected to the second part of the fourth connection terminal and located at the non-display region, wherein
the second connection line is connectable to each of the second terminal wiring, the third terminal wiring and the fourth terminal wiring.

3. The display apparatus according to claim 2, wherein the second connection line crosses over the second terminal wiring, the third terminal wiring and the fourth terminal wiring, and
the second connection line is insulated from the second terminal wiring, the third terminal wiring and the fourth terminal wiring.

4. The display apparatus according to claim 3, comprising an identification mark configured to identify a connecting location of the second connection line and the second terminal wiring or a connecting location of the second connection line and the third terminal wiring.

5. The display apparatus according to claim 1, comprising:
   a first terminal wiring which is connected to the second part of the second connection terminal and the second part of the fourth connection terminal and which is located at the non-display region; and
   a third terminal wiring connected to the second part of the third connection terminal and located at the non-display region; wherein
   the second connection line is connectable to each of the first terminal wiring and the third terminal wiring.

6. The display apparatus according to claim 5, wherein
   the second connection line crosses over each of the first terminal wiring and the third terminal wiring, and
   the second connection line is insulated from the first terminal wiring and the third terminal wiring.

7. A method of manufacturing the display apparatus according to claim 1, comprising:
   inspecting whether each of the first signal line and the second signal line is disconnected; and
   if a disconnection of the first signal line is detected in the inspection step, connecting the second part of the fourth connection terminal and the second part of the second connection terminal through the second connection line, if a disconnection of the second signal line is detected in the inspection step, connecting the second part of the fourth connection terminal and the second part of the third connection terminal through the second connection line.

8. A display apparatus, comprising:
   a display panel having a display region and a non-display region located at peripheries of the display region;
   a first connection part located in the non-display region which includes a first connection terminal, a second connection terminal, and a third connection terminal each of which includes a first part and a second part connected to a wiring and each of which joins two wirings connected to the first part and the second part respectively;
   a second connection part located in the non-display region which includes a fourth connection terminal, a fifth connection terminal, and a sixth connection terminal each of which includes a first part and a second part connected to a wiring and each of which joins two wirings connected to the first part and the second part respectively;
   a first signal line elongated from the first connection part to the display region to transmit an image signal;
   a second signal line elongated from the second connection part to the display region to transmit an image signal;
   a first amplifier which has an input side connected to the first part of the first connection terminal and is located at an outside of the display panel;
   a second amplifier which has an input side connected to the first part of the fourth connection terminal and is located at the outside of the display panel;
   a trunk line located in the non-display region of the display panel and connected to the second part of the first connection terminal and the second part of the fourth connection terminal, and connectable to each of the first signal line and the second signal line;
   a first connection line which includes a connection line that is connected to an output side of the first amplifier and that is connected to the first part of the second connection terminal from the outside of the display panel and which includes a connection line that is connected to an output side of the second amplifier and that is connected to the first part of the fifth connection terminal from the outside of the display panel;
   a second connection line located in the non-display region of the display panel and which is able to connect the second part of the second connection terminal and the second part of the third connection terminal, and able to connect the second part of the fifth connection terminal and the second part of the sixth connection terminal; and
   a first spare wiring which is connected to the first part of the third connection terminal and the first part of the sixth connection terminal, which is routed to the non-display region of the display panel and the outside of the display panel, and which is connectable to each of the first signal line and the second signal line.

9. The display apparatus according to claim 8, wherein
   the first connection part includes a seventh connection terminal,
   the second connection part includes an eighth connection terminal,
   each of the seventh connection terminal and the eighth connection terminal includes a first part and a second part connected to a wiring and each of which joins two wirings connected to the first part and the second part respectively,
   the second connection line is able to connect the second part of the second connection terminal and the second part of the seventh connection terminal, and able to connect the second part of the fifth connection terminal and the second part of the eighth connection terminal in addition to the second part of the second connection terminal and the second part of the third connection terminal, and the second part of the fifth connection terminal and the second part of the sixth connection terminal, and
   the display apparatus comprises a second spare wiring which is connected to the first part of the seventh connection terminal and the first part of the eighth connection terminal, which is routed to the non-display region of the display panel and the outside of the display panel, and which is connectable to each of the first signal line and the second signal line.

10. A method of manufacturing the display apparatus according to claim 9, comprising:
    inspecting whether each of the first signal line and the second signal line is disconnected; and
    if a disconnection of the first signal line is detected in the inspection step, connecting the second part of the second connection terminal and the second part of the third connection terminal or connecting the second part of the second connection terminal and the second part of the seventh connection terminal through the second connection line.

* * * * *